(12) United States Patent
Song

(10) Patent No.: US 9,519,544 B2
(45) Date of Patent: Dec. 13, 2016

(54) MEMORY MODULE AND OPERATION METHOD THEREOF

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 141 days.

(21) Appl. No.: 14/489,064

(22) Filed: Sep. 17, 2014

(65) Prior Publication Data

US 2015/0331769 A1 Nov. 19, 2015

(30) Foreign Application Priority Data

May 19, 2014 (KR) .................. 10-2014-0059737

(51) Int. Cl.
| | | |
|---|---|---|
| G06F 11/00 | (2006.01) |
| G06F 11/14 | (2006.01) |
| G06F 11/20 | (2006.01) |
| G11C 5/14 | (2006.01) |
| G06F 3/06 | (2006.01) |
| G11C 5/04 | (2006.01) |

(52) U.S. Cl.
CPC ......... *G06F 11/1441* (2013.01); *G06F 3/0619* (2013.01); *G06F 3/0647* (2013.01); *G06F 3/0685* (2013.01); *G06F 11/2094* (2013.01); *G11C 5/14* (2013.01); *G11C 5/141* (2013.01); *G06F 11/2015* (2013.01); *G11C 5/04* (2013.01)

(58) Field of Classification Search
USPC .......................................... 714/22
See application file for complete search history.

(56) References Cited

U.S. PATENT DOCUMENTS

2013/0142001 A1* 6/2013 Sweere .............. G06F 12/0866
365/229

FOREIGN PATENT DOCUMENTS

KR 1020120069516 6/2012

\* cited by examiner

*Primary Examiner* — Sarai Butler
(74) *Attorney, Agent, or Firm* — IP & T Group LLP

(57) ABSTRACT

A memory module includes an emergency power supply block, a volatile memory, a nonvolatile memory, and a control block configured to control data of the volatile memory to be backed up in the nonvolatile memory, by using a power supplied from the emergency power supply block, upon a power failure, and control the data of the volatile memory to be recovered, by using data backed up in the nonvolatile memory, upon a power recovery, wherein the control block controls the data of the volatile memory not to be backed up while controlling the data of the volatile memory to be recovered, even upon the power failure.

4 Claims, 4 Drawing Sheets

FIG. 4

| 220_0 1/4 | 220_0 2/4 | 220_0 3/4 | 220_0 4/4 | 220_1 1/4 | 220_1 2/4 | 220_1 3/4 | 220_1 4/4 |
|---|---|---|---|---|---|---|---|
| 220_2 1/4 | 220_2 2/4 | 220_2 3/4 | 220_2 4/4 | 220_3 1/4 | 220_3 2/4 | 220_3 3/4 | 220_3 4/4 |
| 220_4 1/4 | 220_4 2/4 | 220_4 3/4 | 220_4 4/4 | 220_5 1/4 | 220_5 2/4 | 220_5 3/4 | 220_5 4/4 |
| 220_6 1/4 | 220_6 2/4 | 220_6 3/4 | 220_6 4/4 | 220_7 1/4 | 220_7 2/4 | 220_7 3/4 | 220_7 4/4 |

(a)

| ERASED | ERASED | ERASED | ERASED | ERASED | ERASED | 220_1 3/4 | 220_1 4/4 |
|---|---|---|---|---|---|---|---|
| 220_2 1/4 | 220_2 2/4 | 220_2 3/4 | 220_2 4/4 | 220_3 1/4 | 220_3 2/4 | 220_3 3/4 | 220_3 4/4 |
| 220_4 1/4 | 220_4 2/4 | 220_4 3/4 | 220_4 4/4 | 220_5 1/4 | 220_5 2/4 | 220_5 3/4 | 220_5 4/4 |
| 220_6 1/4 | 220_6 2/4 | 220_6 3/4 | 220_6 4/4 | 220_7 1/4 | 220_7 2/4 | 220_7 3/4 | 220_7 4/4 |

(b)

| 220_0 1/4 | 220_0 2/4 | 220_0 3/4 | 220_0 4/4 | 220_1 1/4 | 220_1 2/4 | 220_1 3/4 | 220_1 4/4 |
|---|---|---|---|---|---|---|---|
| 220_2 1/4 | 220_2 2/4 | 220_2 3/4 | 220_2 4/4 | 220_3 1/4 | 220_3 2/4 | 220_3 3/4 | 220_3 4/4 |
| 220_4 1/4 | 220_4 2/4 | 220_4 3/4 | 220_4 4/4 | 220_5 1/4 | 220_5 2/4 | 220_5 3/4 | 220_5 4/4 |
| 220_6 1/4 | 220_6 2/4 | 220_6 3/4 | 220_6 4/4 | 220_7 1/4 | 220_7 2/4 | 220_7 3/4 | 220_7 4/4 |

(c)

MEMORY MODULE AND OPERATION METHOD THEREOF

CROSS-REFERENCE TO RELATED APPLICATIONS

The present application claims priority of Korean Patent Application No. 10-2014-0059737, filed on May 19, 2014, which is incorporated herein by reference in its entirety.

BACKGROUND

1. Field

Exemplary embodiments of the present invention relate to a memory module including a volatile memory and a nonvolatile memory.

2. Description of the Related Art

A memory cell of a volatile memory (for example, a DRAM) may include a transistor which serves as a switch and a capacitor which stores charges (data). Whether data of a memory cell is high (a logic 1) or low (a logic 0) is determined according to whether there is a charge in the capacitor of the memory cell, that is whether the voltage of the terminal of the capacitor is high or low.

Data may be retained without loss as long as the charges accumulated in the capacitors are maintained. However, because the charges stored in the capacitors diminish due to leakage current in the PN junction of an MOS transistor, or the like, data may be lost. In order to prevent loss of data, the data in the memory cell may be read before the data is lost and the capacitor may be recharged in conformity with the read data. The data of the memory cell may be retained when such an operation is cyclically repeated. This recharging process is referred to as a refresh operation.

The memory chips mounted in most memory modules, which are used in data processing systems such as personal computers (PC), work stations, server computers or communication systems, are volatile memories. While volatile memories may operate at high speed, they are likely to lose stored data since refresh operations cannot be performed if power is not supplied. In order to remove such concerns, a memory module having an NVDIMM (non-volatile dual in-line memory module) scheme has been disclosed in the art. The NVDIMM is a memory module in which volatile memory, nonvolatile memory and an emergency power supply are mounted. This prevents data from being lost due to host power failure through an operation of backing up the data of the volatile memory in the nonvolatile memory using the emergency power when the power of the host is unstable.

SUMMARY

Various embodiments may be directed to a memory module which is capable of preventing loss of data even when a power failure occurs in the process of recovering backup data.

In an embodiment, a memory module may include an emergency power supply block, a volatile memory, a nonvolatile memory, and a control block suitable for controlling data of the volatile memory to be backed up in the nonvolatile memory, by using a power supplied from the emergency power supply block, upon a power failure, and controlling the data of the volatile memory to be recovered, by using data backed up in the nonvolatile memory, upon a power recovery, wherein the control block controls the data of the volatile memory not to be backed up while controlling the data of the volatile memory to be recovered, even upon the power failure.

When the power failure occurs while recovering the data of the volatile memory, the nonvolatile memory may be shut down.

The memory module may further include a power fail sensing block suitable for sensing the power failure of the host, and the emergency power supply block may include one or more capacitors.

In an embodiment, a memory module may include an emergency power supply block, a volatile memory, a nonvolatile memory, and a control block suitable for controlling data of the volatile memory to be backed up in the nonvolatile memory, by using power of the emergency power supply block, upon a power failure, and controlling the data of the volatile memory to be recovered, by using data backed up in the nonvolatile memory, upon a power recovery, wherein, after recovery of the data of the volatile memory is completed, a plurality of memory blocks in the nonvolatile memory are sequentially erased, and wherein, when the power failure occurs while the plurality of memory blocks in the nonvolatile memory are sequentially erased, recovered data of the volatile memory are backed up in memory blocks completely erased among the plurality of memory blocks.

When the power failure occurs while the plurality of memory blocks in the nonvolatile memory are sequentially erased, the other memory blocks among the plurality of memory blocks may retain data backed up therein.

In an embodiment, an operation method of a memory module including a volatile memory and a nonvolatile memory may include sensing a failure in a host power, converting a power of the memory module, from the host power to an emergency power, backing up data of the volatile memory in the nonvolatile memory, recovering the host power, recovering the data of the volatile memory by using data backed up in the nonvolatile memory, and shutting down the memory module when the failure in the host power is sensed in the recovering of the data of the volatile memory.

The operation method may further include erasing sequentially a plurality of memory blocks in the nonvolatile memory after the recovering of the data of the volatile memory, and backing up recovered data of the volatile memory in memory blocks completely erased among the plurality of memory blocks, when the power failure occurs in the erasing of the plurality of memory blocks.

In an embodiment, an operation method of a memory module including a volatile memory and a nonvolatile memory may include sensing a failure in a host power, converting a power of the memory module, from the host power to an emergency power, backing up data of the volatile memory in the nonvolatile memory, recovering the host power, recovering the data of the volatile memory by using data backed up in the nonvolatile memory, erasing sequentially a plurality of memory blocks in the nonvolatile memory, and backing up recovered data of the volatile memory in memory blocks completely erased among the plurality of memory blocks, when the power failure occurs in the erasing of the plurality of memory blocks.

In the backing up of the data of the volatile memory in the memory blocks completely erased, the other memory blocks among the plurality of memory blocks may retain data backed up therein.

In an embodiment, an operation method of a memory module including a volatile memory and a nonvolatile memory may include sensing a host power, backing up data of the volatile memory in the nonvolatile memory using an emergency power when the host power is sensed unstable in the sensing of the host power, recovering the data of the volatile memory by using data backed up in the nonvolatile memory when the host power is sensed to be recovered in the sensing of the host power, and shutting down the memory module when the host power is sensed unstable in the sensing of the host power during the recovering of the data of the volatile memory.

The method may further include erasing sequentially a plurality of memory blocks in the nonvolatile memory after the recovering of the data of the volatile memory, and backing up recovered data of the volatile memory in memory blocks erased in the erasing of the plurality of memory blocks when the host power is sensed as being unstable in the sensing of the host power during the erasing of the plurality of memory blocks.

BRIEF DESCRIPTION OF THE DRAWINGS

FIG. 4 is a chart showing the data stored in memory blocks inside a nonvolatile memory 240 in the processes of S360 to S362 of FIG. 3.

DETAILED DESCRIPTION

Figure 1:
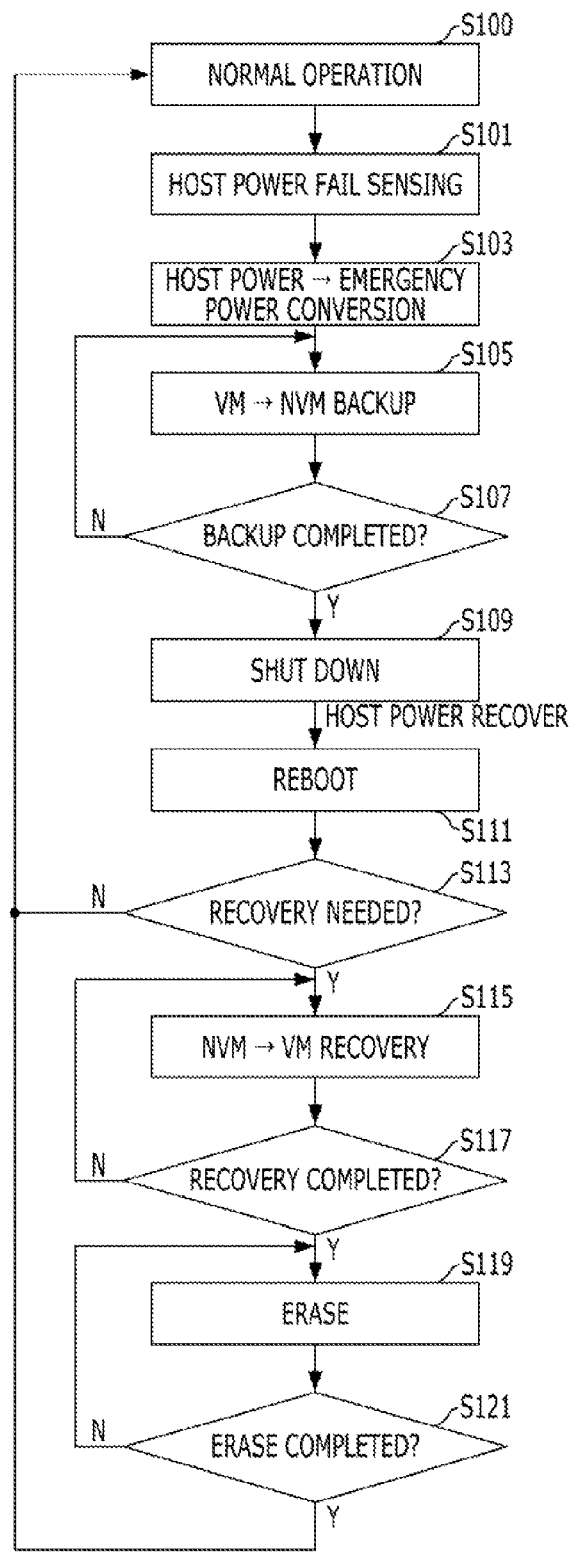
FIG. 1 is a flow chart explaining operations of a memory module (for example, a NVDIMM) including a volatile memory and a nonvolatile memory, according to a comparative example.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings, thickness and length of components are exaggerated for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form as long as it is not specifically mentioned. Furthermore, 'include/comprise' or 'including/comprising' used in the specification represents that one or more components, steps, operations, and elements exist or are added.

FIG. 1 is a flow chart explaining operations of a memory module (for example, a NVDIMM) including a volatile memory and a nonvolatile memory, as a comparative example.

Referring to FIG. 1, the memory module may perform a normal operation (S100). That is, the memory module may perform read and write operations at the request of a host.

In the case where a failure of host power is sensed (S101) while the memory module is performing normal operations, the memory module may start a backup operation. The failure of the host power may mean that the power supplied from the host is unstable to the extent that it is difficult for the memory module to operate normally.

After the failure of the host power is sensed, the memory module may convert from using the unstable host power to using an emergency power source that is built into the memory module (S103).

Then, the data stored in the volatile memory (for example, a DRAM) of the memory module may be backed up in a nonvolatile memory (for example, a NAND flash) of the memory module (S105 and S107). A read operation may be repeatedly performed in the volatile memory and data may be read, and a program operation may be repeatedly performed in the nonvolatile memory and the data read from the volatile memory may be written. After the backup operation is completed, the memory module may be shut down (S109).

Thereafter, when the host power is recovered to a normal state (HOST POWER RECOVER), the memory module may be rebooted (S111). After the rebooting, whether there are backup data in the nonvolatile memory, that is, whether it is necessary to recover the volatile memory, may be determined (S113). When it is unnecessary to recover the volatile memory, the memory module may perform normal operations according to an instruction from the host (S100).

When it is necessary to recover the volatile memory, the data of the volatile memory may be recovered using the data backed up in the nonvolatile memory (S115 and S117). A read operation may be repeatedly performed in the nonvolatile memory and data may be read, and a write operation may be repeatedly performed in the volatile memory and the data read from the nonvolatile memory may be written.

After the recovery is completed, the nonvolatile memory may be erased (S119 and S121). A plurality of memory blocks exist in the nonvolatile memory. The memory blocks may be sequentially erased. The reason why the nonvolatile memory is erased may be to enable backup operation in another host power failure. After the erase operation of the nonvolatile memory is completed, the memory module may perform normal operations according to an instruction from the host (S100).

In the operation scheme of FIG. 1, if a failure of the host power occurs while performing normal operations, a backup operation (S105 and S107) is performed. When the host power returns to a stable state thereafter, the recovery operations (S111, S113, S115 and S117) and the erase operations (S119 and S121) are performed. However, if the series of backup processes starting from the step S101 shown in FIG. 1 are repeated even in the case where a failure of the host power occurs while performing the recovery operation (S111, S113, S115 and S117), the memory module may be in danger of losing all data. That is to say, since the data of the volatile memory are not yet completely recovered, the incomplete data of the volatile memory may be backed up in the nonvolatile memory and the backup data of the nonvolatile memory may be ruined. Similarly, even in the case where a failure of the host power occurs while performing the erase operation (S119 and S121), the erase operation of the nonvolatile memory may be unstable, and data may be distorted or the backup operation may become impossible.

Hereinafter, descriptions will be made for a memory module which does not lose data even when a failure of host power occurs while performing recovery and erase operations, and an operation method thereof.

Figure 2:
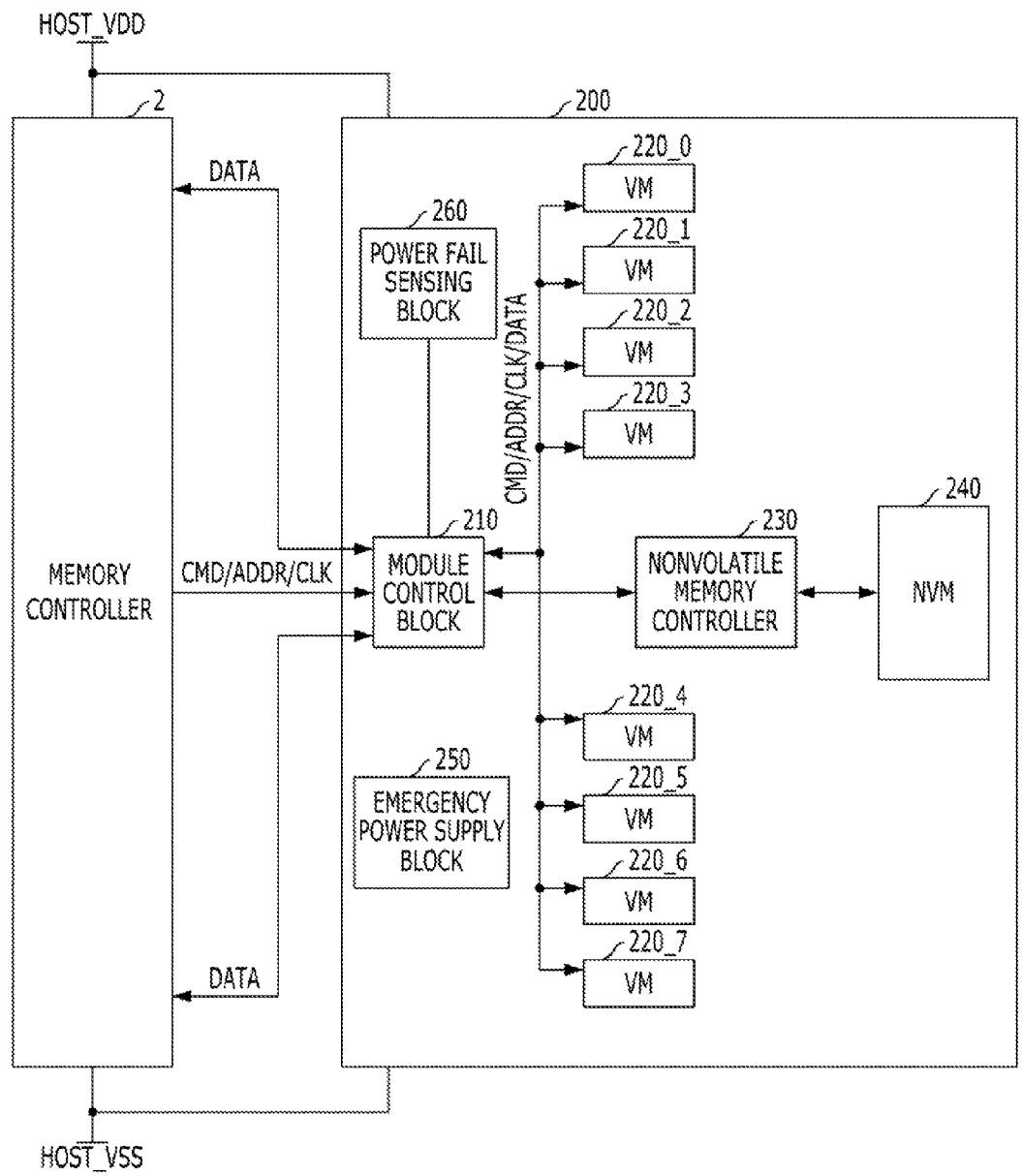
FIG. 2 is a configuration diagram of a memory module 200 in accordance with an embodiment.

FIG. 2 is a configuration diagram of a memory module 200 in accordance with an embodiment of the present invention.

Referring to FIG. 2, the memory module 200 may prevent the loss of data even in a power failure, through an operation of backing up the data stored in volatile memories (chips) 220_0 to 220_7 in a nonvolatile memory (chip) 240 when the power of a host is unstable. For a simple explanation, the memory module 200 is shown together with a memory controller 2 on the host, which transmits and receives data DATA and provides a command CMD, an address ADD and a clock CLK for controlling the memory module 200.

Referring to FIG. 2, the memory module 200 may include a module control block 210, the volatile memories 220_0 to 220_7, a nonvolatile memory controller 230, the nonvolatile memory 240, an emergency power supply block 250, and a power fail sensing block 260. Each of the volatile memories 220_0 to 220_7 may be a DRAM, and the nonvolatile memory 240 may be a FLASH memory. However, each of the volatile memories 220_0 to 220_7 may be a different kind of volatile memory other than a DRAM, and the nonvolatile memory 240 may be a different kind of nonvolatile memory other than a flash memory.

When powers HOST_VDD and HOST_VSS of the host are normal/stable, the module control block 210 may buffer the command CMD, the address ADD and the clock CLK provided from the memory controller 2, and may provide them to the volatile memories 220_0 to 220_7. The module control block 210 may buffer the data DATA provided from the memory controller 2 and provide it to the volatile memories 220_0 to 220_7, or may buffer the data DATA provided from the volatile memories 220_0 to 220_7 and transmit it to the memory controller 2. That is to say, when the powers HOST_VDD and HOST_VSS of the host are normal, the module control block 210 may perform the function of relaying communication between the volatile memories 220_0 to 220_7 and the memory controller 2.

If a failure in the host powers HOST_VDD and HOST_VSS is sensed by the power fail sensing block 260, that is, if a power supply voltage HOST_VDD and a ground voltage HOST_VSS supplied from the host is sensed as being unstable, the power fail sensing block 260 may interrupt the supply of the host powers HOST_VDD and HOST_VSS to the memory module 200, and may control the memory module 200 to operate using the power of the emergency power supply block 250. The emergency power supply block 250 may be realized using one or more capacitors, for example, a super capacitor with large capacity, and may supply emergency power while the data of the volatile memories 220_0 to 220_7 are backed up in the nonvolatile memory 240. Meanwhile, if the failure in the host powers HOST_VDD and HOST_VSS is sensed, the power fail sensing block 260 may inform the module control block 210 of the failure in the host powers HOST_VDD and HOST_VSS.

If a failure in the host powers HOST_VDD and HOST_VSS is sensed, the module control block 210 may control the data stored in the volatile memories 220_0 to 220_7, to be backed up in the nonvolatile memory 240. In detail, the module control block 210 may control the data stored in the volatile memories 220_0 to 220_7 to be read, by applying a command CMD, an address ADD and a clock CLK generated within itself, to the volatile memories 220_0 to 220_7. The module control block 210 may control the nonvolatile memory controller 230 in such a manner that the data read from the volatile memories 220_0 to 220_7 may be programmed (written) in the nonvolatile memory 240. The nonvolatile memory controller 230 may control the nonvolatile memory 240 in such a manner that data DATA transferred from the module control block 210, that is, the data read from the volatile memories 220_0 to 220_7, may be programmed in the nonvolatile memory 240.

The data of the volatile memories 220_0 to 220_7, which are backed up in the nonvolatile memory 240 upon occurrence of the failure in the host powers HOST_VDD and HOST_VSS, may be transmitted to and recovered in the volatile memories 220_0 to 220_7 in response to the control of the module control block 210 and the nonvolatile memory controller 230 after the host powers HOST_VDD and HOST_VSS return to a normal state. Also, after the recovery is completed, the backup data stored in the nonvolatile memory 240 may be erased in response to the control of the module control block 210 and the nonvolatile memory controller 230.

While it is shown in FIG. 2 that 8 volatile memories 220_0 to 220_7 and 1 nonvolatile memory 240 are provided in the memory module 200, this is for illustration purposes only, and it is to be noted that the numbers of volatile and nonvolatile memories provided in the memory module 200 may be equal to or greater than 1. Also, while it is shown in FIG. 2 that the data of the volatile memories 220_0 to 220_7 are transferred to the nonvolatile memory 240 through the module control block 210 and the nonvolatile memory controller 230, it is to be noted that data may be directly transmitted between the volatile memories 220_0 to 220_7 and the nonvolatile memory 240 if the data transmission protocols of the volatile memories 220_0 to 220_7 and the nonvolatile memory 240 are designed to be compatible with each other. Moreover, it is to be noted that the components shown in FIG. 2 give functional classification and do not convey physical distinguishment. For example, while each of the components shown in FIG. 2 may represent one semiconductor chip, it is envisaged that two or more of the components shown in FIG. 2 may be formed on one physical semiconductor chip.

Figure 3:
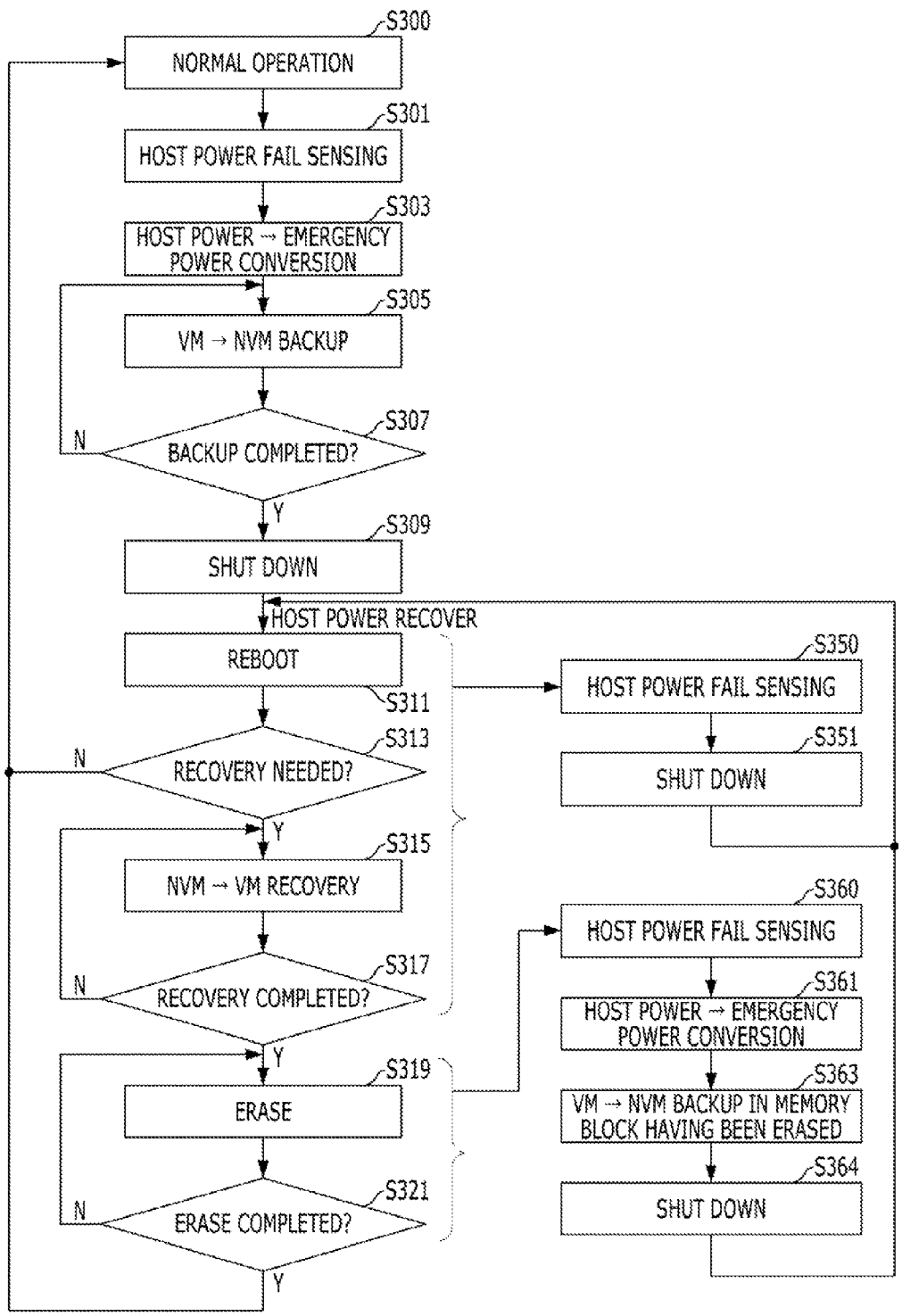
FIG. 3 is a flow chart explaining operations of the memory module 200 in accordance with the embodiment.

FIG. 3 is a flow chart explaining operations of the memory module 200 in accordance with the embodiment of the present invention.

Referring to FIG. 3, the memory module 200 may perform a normal operation (S300). That is, the memory module 200 may perform operations such as read and write operations, at the request of the host 2.

In the case where a failure in the host powers HOST_VDD and HOST_VSS is sensed (S301) by the power fail sensing block 260, while the memory module 200 performs normal operations, the memory module 200 may start a backup operation. The failure in the host powers HOST_VDD and HOST_VSS may mean that the powers HOST_VDD and HOST_VSS supplied from the host 2 are unstable to the extent that it is difficult for the memory module 200 to operate.

After the failure in the host powers HOST_VDD and HOST_VSS is sensed, the memory module 200 may convert from the unstable host powers HOST_VDD and HOST_VSS to an emergency power built in the memory module 200, that is, the power of the emergency power supply block 250 (S303).

Then, the data stored in the volatile memories 220_0 to 220_7 of the memory module 200 may be backed up in the nonvolatile memory 240 (S305 and S307). A read operation may be repeatedly performed in the volatile memories 220_0 to 220_7 and data may be read, and a program operation may be repeatedly performed in the nonvolatile memory 240 and the data read from the volatile memories 220_0 to 220_7 may be written. After the backup operation is completed, the memory module 200 may be shut down (S309).

Thereafter, when the host powers HOST_VDD and HOST_VSS are recovered to a normal state (HOST POWER RECOVER), the memory module 200 may be rebooted (S311). After the rebooting, whether there are backup data in the nonvolatile memory 240, that is, whether it is needed to recover the volatile memories 220_0 to 220_7, may be determined (S313). When it is not needed to recover the volatile memories 220_0 to 220_7, the memory module 200 may perform nor operations according to an instruction from the host 2 (S300).

When it is necessary to recover the volatile memories 220_0 to 220_7, the data of the volatile memories 220_0 to 220_7 may be recovered using the data backed up in the nonvolatile memory 240 (S315 and S317). A read operation may be repeatedly performed in the nonvolatile memory 240 and data may be read, and a write operation may be repeatedly performed in the volatile memories 220_0 to 220_7 and the data read from the nonvolatile memory 240 may be written.

After the recovery is completed, the nonvolatile memory 240 may be erased (S319 and S321). A plurality of memory blocks exist in the nonvolatile memory 240. The memory blocks may be sequentially erased. The reason why the nonvolatile memory 240 is erased may be to enable a backup operation in response to another failure in the host powers HOST_VDD and HOST_VSS. After the erase operation of the nonvolatile memory 240 is completed, the memory module 200 may perform normal operations according to an instruction from the host 2 (S300).

During the steps S311 to S317 from after the rebooting of the memory module 200 to before the recovery is completed, in the case where a failure in the host powers HOST_VDD and HOST_VSS is sensed by the power fail sensing block 260 (S350), the memory module 200 may not perform the backup operation and may be immediately shut down (S351). This is because, in this case, correct backup data for the recovery of the volatile memories 220_0 to 220_7 are already stored in the nonvolatile memory 240. It is not necessary to perform the backup operation any more. Rather, in this case, if the backup operation is performed, the backup data stored in the nonvolatile memory 240 are likely to be ruined or destroyed. Since the purpose of the shutdown is to conserve the backup data stored in the nonvolatile memory 240, only the nonvolatile memory 240 may be shut down in the memory module 200.

When a failure in the host powers HOST_VDD and HOST_VSS is sensed by the power fail sensing block 260 (S360) while the nonvolatile memory 240 is erased (S319 to S321), the memory module 200 may convert from the unstable host powers HOST_VDD and HOST_VSS to an emergency power, that is, the power of the emergency power supply block 250 (S361). Further, while stopping the erase operation, the data of volatile memories may be backed up in only memory blocks on which the erase operation has been (or is being) performed (S363). After the backup operation is completed, the memory module 200 may be shut down (S364).

FIG. 4 is a chart showing the data stored in the memory blocks inside the nonvolatile memory 240 in the processes of S360 to S362 of FIG. 3. Referring to (A) of FIG. 4, it may be seen that backup data corresponding to the volatile memories 220_0 to 220_7 are stored in the memory blocks in the nonvolatile memory 240. The quadrangles of the drawing represent memory blocks, and the numerals 220_0 1/4 to 220_0 4/4 represent the backup data of the volatile memory 220_0 which are divisionally stored in 4 memory blocks. Similarly, the numerals 220_3 1/4 to 220_3 4/4 represent the backup data of the volatile memory 2203 which are divisionally stored in 4 memory blocks. (B) of FIG. 4 shows that the erase operation has been performed for 6 memory blocks. If a failure in the host powers HOST_VDD and HOST_VSS is detected in this state, the erase operation is no longer performed in the nonvolatile memory 240, and the data of the volatile memories 220_0 and 220_1 are backed up in the 6 memory blocks for which the erase operation has been already performed. Referring to (C) of FIG. 4, it may be seen that the data of the volatile memories 220_0 and 220_1 are backed up again in the erased memory blocks and the complete backup data corresponding to the entire volatile memories 220_0 to 220_7 are stored in the nonvolatile memory 240. The blocks drawn in diagonal lines in (C) of FIG. 4 represent the blocks which have been backed up again through the step S363.

According to the embodiments, even when a failure in the host powers HOST_VDD and HOST_VSS occurs while recovering the data of the volatile memories 220_0 to 220_7 or a failure in the host powers HOST_VDD and HOST_VSS occurs while performing the erase operation for the nonvolatile memory 240, the data of the nonvolatile memory 240 may be conserved for the complete recovery of the data of the volatile memories 220_0 to 220_7.

As is apparent from the above descriptions, according to the embodiments, loss of data may be prevented even when a power failure occurs in the process of recovering backup data.

Although various embodiments have been described for illustrative purposes, it will be apparent to those skilled in the art that various changes and modifications may be made without departing from the spirit and scope of the invention as defined in the following claims.

What is claimed is:

1. A memory module comprising:
   an emergency power supply block;
   a volatile memory;
   a nonvolatile memory; and
   a control block suitable for controlling data of the volatile memory to be backed up in the nonvolatile memory, by using a power of the emergency power supply block, upon a power failure, and controlling the data of the volatile memory to be recovered, by using data backed up in the nonvolatile memory, upon a power recovery,
   wherein, after recovery of the data of the volatile memory is completed, a plurality of memory blocks in the nonvolatile memory are sequentially erased, and
   wherein, when the power failure occurs while the plurality of memory blocks in the nonvolatile memory are sequentially erased, recovered data of the volatile memory are backed up in memory blocks completely erased among the plurality of memory blocks.

2. The memory module according to claim 1, wherein, when the power failure occurs while the plurality of memory blocks in the nonvolatile memory are sequentially erased, the other memory blocks which are not erased among the plurality of memory blocks retain data backed up therein.

3. An operation method of a memory module including a volatile memory and a nonvolatile memory, the method comprising:
   sensing a failure in a host power;
   converting a power of the memory module, from the host power to an emergency power;
   backing up data of the volatile memory in the nonvolatile memory;
   recovering the host power;

recovering the data of the volatile memory by using data backed up in the nonvolatile memory;

erasing sequentially a plurality of memory blocks in the nonvolatile memory after the recovering of the data of the volatile memory; and backing up recovered data of the volatile memory in memory blocks completely erased among the plurality of memory blocks, when the power failure occurs in the erasing of the plurality of memory blocks.

4. The operation method according to claim 3, wherein, in the backing up of the data of the volatile memory in the memory blocks completely erased, the other memory blocks which are not erased among the plurality of memory blocks retain data backed up therein.

* * * * *